United States Patent
Doyle et al.

(10) Patent No.: US 10,806,026 B2
(45) Date of Patent: Oct. 13, 2020

(54) MODIFIED PCB VIAS TO PREVENT BURN EVENTS

(71) Applicant: International Business Machines Corporation, Armonk, NY (US)

(72) Inventors: Matthew S. Doyle, Chatfield, MN (US); Joseph Kuczynski, North Port, FL (US); Jeffrey N. Judd, Oronoco, MN (US); Scott D. Strand, Rochester, MN (US); Timothy J. Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/564,578

(22) Filed: Sep. 9, 2019

(65) Prior Publication Data
US 2020/0022257 A1    Jan. 16, 2020

Related U.S. Application Data

(62) Division of application No. 16/033,487, filed on Jul. 12, 2018, now abandoned.

(51) Int. Cl.
*H05K 1/00* (2006.01)
*H05K 1/02* (2006.01)
(Continued)

(52) U.S. Cl.
CPC ........... *H05K 1/0293* (2013.01); *H05K 1/115* (2013.01); *H05K 3/0047* (2013.01);
(Continued)

(58) Field of Classification Search
CPC .. H05K 1/00; H05K 1/02; H05K 1/09; H05K 1/11; H05K 1/16; H05K 3/42; H05K 3/46;
(Continued)

(56) References Cited

U.S. PATENT DOCUMENTS

| 3,735,315 A | 5/1973 | Swarbrick et al. |
| 4,068,370 A | 1/1978 | Nordberg et al. |

(Continued)

FOREIGN PATENT DOCUMENTS

| JP | 2006244948 A | 9/2006 |
| JP | 2011077062 A | 4/2011 |

OTHER PUBLICATIONS

"Fuse Protection for Multi-Processor Boards" Disclosed Anonymously IPCOM000135661D Apr. 20, 2006.
(Continued)

*Primary Examiner* — Xiaoliang Chen
(74) *Attorney, Agent, or Firm* — Patterson + Sheridan, LLP

(57) ABSTRACT

A fusible via is disclosed. The fusible via includes an upper contact. The fusible via further includes a handle portion having a first end and a second end. The upper contact is disposed on the first end of the handle portion. The handle portion comprises an alloy and a blowing agent. The alloy melts above a predefined solder reflow temperature but below a thermal degradation temperature of the blowing agent. The fusible via further includes a lower contact disposed on the second end of the handle portion.

7 Claims, 6 Drawing Sheets

(51) Int. Cl.
  *H05K 1/09* (2006.01)
  *H05K 1/11* (2006.01)
  *H05K 1/16* (2006.01)
  *H05K 3/42* (2006.01)
  *H05K 3/46* (2006.01)
  *H01L 21/02* (2006.01)
  *H01L 21/50* (2006.01)
  *H01L 21/60* (2006.01)
  *H01L 23/02* (2006.01)
  *H01L 23/04* (2006.01)
  *H01L 23/48* (2006.01)
  *H01L 23/52* (2006.01)
  *H05K 3/40* (2006.01)
  *H05K 3/00* (2006.01)

(52) U.S. Cl.
  CPC . *H05K 3/4038* (2013.01); *H05K 2201/10181* (2013.01); *H05K 2203/081* (2013.01)

(58) Field of Classification Search
  CPC ......... H01L 21/02; H01L 21/50; H01L 21/60; H01L 23/02; H01L 23/04; H01L 23/48; H01L 23/52
  USPC ........... 174/260, 262, 263; 29/838; 337/143, 337/159, 279
  See application file for complete search history.

(56) References Cited

U.S. PATENT DOCUMENTS

| | | | |
|---|---|---|---|
| 4,150,353 A | 4/1979 | Huber et al. | |
| 4,161,712 A | 7/1979 | Thiel | |
| 4,274,698 A | 6/1981 | Ahroni | |
| 4,394,639 A | 7/1983 | McGalliard | |
| 4,625,195 A * | 11/1986 | Robbins | H01H 85/42 337/159 |
| 4,638,283 A | 1/1987 | Frind et al. | |
| 4,641,120 A | 2/1987 | Bonfig et al. | |
| 4,762,509 A | 8/1988 | Schaefer | |
| 4,841,356 A | 6/1989 | Howton et al. | |
| 5,167,545 A * | 12/1992 | O'Brien | H01R 4/723 439/578 |
| 5,252,942 A | 10/1993 | Gurevich | |
| 5,475,357 A | 12/1995 | Chien et al. | |
| 6,039,607 A | 3/2000 | Cheung | |
| 6,168,969 B1 * | 1/2001 | Farnworth | H01L 23/5256 438/106 |
| 6,225,652 B1 * | 5/2001 | Devanney | H01L 23/5258 257/209 |
| 6,300,232 B1 | 10/2001 | Satoh | |
| 6,716,065 B1 | 4/2004 | Brooks | |
| 6,734,781 B1 | 5/2004 | Nagashima | |
| 7,639,040 B2 | 12/2009 | Woyda-Wolf | |
| 9,190,235 B2 | 11/2015 | Wiryana et al. | |
| 2003/0020589 A1 | 1/2003 | Scoggin | |
| 2003/0077484 A1 | 4/2003 | Cho | |
| 2003/0224197 A1 | 12/2003 | Soga et al. | |
| 2004/0007384 A1 | 1/2004 | Soga et al. | |
| 2004/0053001 A1 | 3/2004 | Abrams | |
| 2004/0217441 A1 | 11/2004 | Lehmann et al. | |
| 2005/0266204 A1 | 12/2005 | Abrams | |
| 2007/0025267 A1 | 2/2007 | Padovani et al. | |
| 2007/0222029 A1 | 9/2007 | Ueda | |
| 2007/0236322 A1 | 10/2007 | Skinner | |
| 2010/0033293 A1 | 2/2010 | Cheng et al. | |
| 2010/0252908 A1 | 10/2010 | Schlarmann | |
| 2011/0177311 A1 | 7/2011 | Manabe et al. | |
| 2014/0218159 A1 | 8/2014 | Wosgien et al. | |
| 2014/0246704 A1 | 9/2014 | Yamada et al. | |
| 2015/0137934 A1 | 5/2015 | von zur Muehlen et al. | |
| 2016/0133422 A1 | 5/2016 | Breili | |
| 2016/0374203 A1 * | 12/2016 | Bakre | H05K 1/0265 |
| 2018/0363174 A1 | 12/2018 | Kondo et al. | |

OTHER PUBLICATIONS

U.S. Appl. No. 16/033,487 "Modified PCB Vias to Prevent Burn Events," filed Jul. 12, 2018.

IBM, "List of IBM Patents or Patent Applications Treated as Related," for U.S. Appl. No. 16/564,578, filed Sep. 9, 2019.

* cited by examiner

MODIFIED PCB VIAS TO PREVENT BURN EVENTS

CROSS-REFERENCE TO RELATED APPLICATIONS

This application is a divisional of co-pending U.S. patent application Ser. No. 16/033,487, filed Jul. 12, 2018. The aforementioned related patent application is herein incorporated by reference in its entirety.

BACKGROUND

The present invention relates to a printed circuit board (PCB) via, and more specifically, to a printed circuit board via having the functionality of a fuse.

Automated CAD tools are capable of providing computer aided design checking. However, even with automatic design checking, errors occur in the design of printed circuit boards (PCB)s. Some of the errors represent a form of minimal power-to-power or power-to-ground clearance between voltage shapes and/or PCB vias, pins, or component pads. Given normal manufacturing tolerances, layer-to-layer mis-registration can allow these clearance concerns to become DC power shorting events.

There are many devices presently utilized to provide overcurrent protection against PCB shorting events. Through various mechanisms, voltage, current, and temperature are monitored in an effort to sense a runaway event which could cause a DC short, leading to a PCB burn event. These devices are implemented through active component monitoring. The drawback to these solutions includes the fact that the monitoring devices may not be fast enough, or able to detect the impedance of the PCB short, such that current is ceased before smoke is released from the PCB materials or active components.

A fuse is a current limiting device that protects valuable equipment and resources (e.g., a load or source circuit) from damage due to a DC short. In many typical fuses, the fuse element is a metal wire or strip that melts when too much current flows through it, interrupting the circuit that it connects. Short circuits, overloading, mismatched loads, or device failure are the prime reasons for excessive current. The fuse interrupts excessive current ("blows") such that further damage by overheating is prevented. The time and current operating characteristics of fuses are chosen to provide adequate protection without needless interruption. Fuses are manufactured in a wide range of current and voltage ratings to protect wiring systems and electrical equipment. Although these prior art fuses have proven useful in their limited prior art applications, they are relatively expensive and subject to misuse and the problem of storing spare fuses. Additionally, fuses cannot be implemented easily in the inner layers of multi-layer PCBs, and their size makes them expensive consumers of PCB outer surface area.

SUMMARY

According to one embodiment, a fusible via includes an upper contact. The fusible via further includes a handle portion having a first end and a second end. The upper contact is disposed on the first end of the handle portion. The handle portion comprises an alloy and a blowing agent. The alloy melts above a predefined solder reflow temperature but below a thermal degradation temperature of the blowing agent. The fusible via further includes a lower contact disposed on the second end of the handle portion.

According to another embodiment, a method for forming a fusible via in a printed circuit board (PCB) structure having two or more metallization layers includes forming a hole in the PCB structure that penetrates the upper metallization layer and an insulation layer disposed below the upper metallization layer of the PCB structure, but not a lower metallization layer of the PCB structure disposed below the insulating layer. The method further includes filling the hole with a fusible material comprising an alloy and a blowing agent to form a handle portion, wherein the alloy melts above a predefined solder reflow temperature but below a thermal degradation temperature of the blowing agent. The method further includes forming holes in the upper metallization layer and the lower metallization layer that are wider than the hole containing the fusible material. The method further includes filling the larger diameter holes with an interconnect metal to form upper and lower contacts, respectively.

According to another embodiment, a printed circuit board (PCB) structure includes a handle portion formed of a fusible material formed in the PCB structure that penetrates an upper metallization layer and an insulation layer disposed below the upper metallization layer of the PCB structure, but not a lower metallization layer of the PCB structure disposed below the insulating layer. The fusible material comprises an alloy and a blowing agent. The alloy melts above a predefined solder reflow temperature but below a thermal degradation temperature of the blowing agent. An interconnect metal is formed in the upper metallization layer to form an upper contact and the lower metallization layer to form a lower contact that are wider than the hole containing the fusible material. The upper contact and the lower contact contacting opposing ends of the handle portion.

DETAILED DESCRIPTION

This disclosure teaches a novel approach to the design, implementation, and manufacture of a Printed Circuit Board (PCB) interlayer fusible via. The need for the fusible via is based the avoidance of an over-current burn event made possible with (plated barrel and/or solder) via structures—often seen in power vias. Example fusible vias of the present disclosure employ an alloy material that melts above a solder reflow temperature but below a thermal degradation temperature of a blowing agent.

Figure 1:
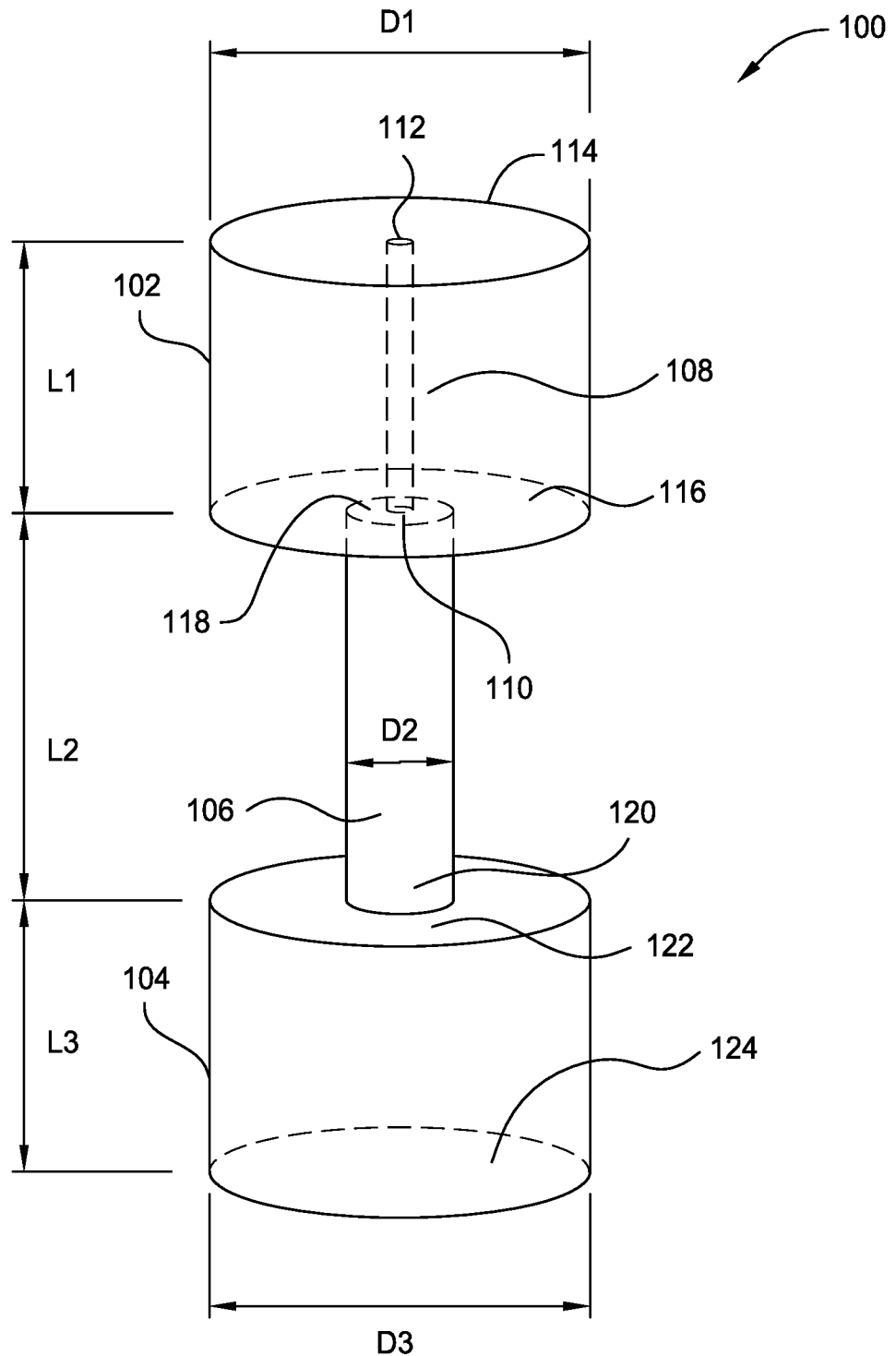
FIG. 1 is a perspective view of a fusible via 100 in accordance with an embodiment of the present disclosure.

FIG. 1 is a perspective view of a fusible via 100 in accordance with an embodiment of the present disclosure. The fusible via 100 is shaped like a dumbbell. The fusible via 100 includes an upper contact 102, a lower contact 104, and a handle portion 106 disposed between the upper contact 102 and the lower contact 104. The upper contact 102, the lower contact 104, and the handle portion 106 may be substantially cylindrical in shape. The upper contact 102 has an upper surface 114, a lower surface 116, a first length L1, and a first diameter D1. The lower contact 104 has an upper surface 122, a lower surface 124, a second length L3 that is substantially the same as the first length L1, and a second diameter D3 that is substantially the same as the first diameter D1. The handle portion 106 has an upper surface 118, a lower surface 120, a third length L2, and a third diameter D2. The handle portion 106 may have a smaller diameter D2 than either the diameter D1 of the upper contact 102 or diameter D3 of the lower contact 104. The handle portion 106 may have larger length L2 than either the length L1 of the upper contact 102 or the length L3 of the lower contact 104. The length L2 and the diameter D2 of the handle portion 106 are variable to accommodate different blowing currents. The handle portion 106 of the fusible via 100 may be solid and made from a fusible alloy and a blowing agent, respectively. The upper contact 102 and the lower contact 104 may be made of an interconnect metal (e.g., deposited copper/alloy). A vent hole 108 may be formed in the upper contact 102, the lower contact 104, or both the upper contact 102 and the lower contact 104 and contacts the handle portion 106 to permit blowing agent gases to escape from the fusible via 100 in a controlled way. The vent hole 108 extends from an interface 110 between the contacts 102, 104 and the handle portion 106 and an outer surface 112 of the contacts 102, 104.

The alloy is operable to melt above a solder reflow temperature but below a thermal degradation temperature of the blowing agent. Above a trigger temperature, the blowing agent sublimes, which forces the alloy (which has melted) out of the handle portion 106. In this way the fusible via acts as a fuse. As noted above, the handle portion 106 diameter D2 permits the fusible via 100 to be tunable based on current carrying capability. An alloy that melts in the temperature range 265 C<Tm<Tsub, where Tsub is the sublimation temperature of the blowing agent, and Tm is the melting point of the alloy, is blended with the blowing agent. Non-limiting examples of suitable blowing agents are shown in Table 1.

TABLE 1

| Material | Sublimation Temp (C.) |
| --- | --- |
| Phthalic anhydride | 295 |
| Terephthalic acid | 402 |
| Adamantane | 270 |

Non-limiting examples of suitable alloys are shown in Table 2.

TABLE 2

| Alloy | Solidus Temperature (C.) | Liquidus Temperature (C.) |
| --- | --- | --- |
| 90/10 Pb/Sn | 275 | 302 |
| 88/10/2 Pb/Sn/Ag | 267 | 290 |
| Bi | 271 | 271 |

FIGS. 2-7 illustrate cross-sectional views of a process for manufacturing the fusible via 100 in-situ within a single layer printed circuit board (PCB) 200. The fusible via 100 is fabricated using a double drill process, i.e., a small diameter hole 302 is drilled first followed by a larger diameter hole drilled a portion of the way through the PCB 200 from both the front side 208 of the PCB 200 and the back side 210 of the PCB 200. The alloy is melted, and the blowing agent is dispersed using any conventional mixing method. In one example, the bottom of the fusible via 100 may be plugged (with a suitable material containing the small vent hole 108 to permit the air in the fusible via 100 to escape); then the modified alloy is poured at a predefined temperature into the fusible via 100. Upon cooling, the alloy solidifies and a fusible link of the handle portion 106 is created.

During operation, if the current passing through the fusible via 100 exceeds a critical value of current, the temperature of the handle portion 106 rises, the alloy of the handle portion 106 melts, and upon further heating, the blowing agent sublimes, resulting in orders of magnitude increase in volume (upon subliming from the solid to the gas) which explosively forces the alloy from the handle portion 106 of the fusible via 100 to escape through the vent hole 108. The fusible via 100 becomes electrically open and current ceases to flow through the blown fusible via 100.

Figure 2:
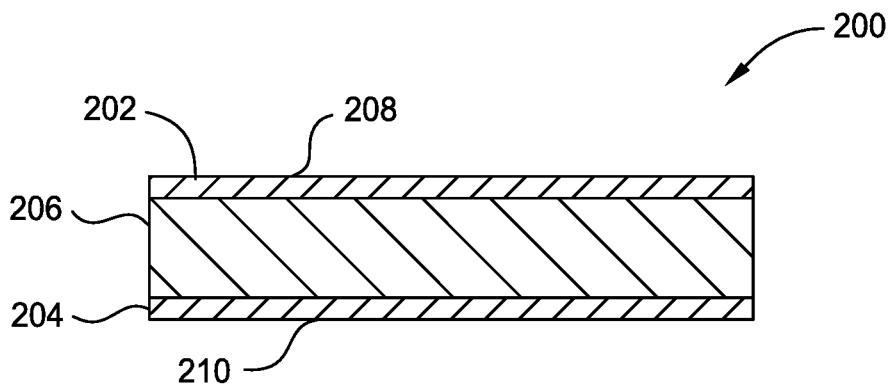
FIG. 2 is a cross-sectional view of an initial printed circuit board structure (PCB) 200 according to a first embodiment to form the fusible via in-situ in the PCB.

FIG. 2 is a cross-sectional view of an initial printed circuit board structure (PCB) 200 according to a first embodiment to form the fusible via 100 in-situ in the PCB 200. The PCB 200 may have one or more layers (a single layer is shown). The PCB 200 comprises an upper metallization layer 202, a lower metallization layer 204, and an insulating layer 206 disposed between the upper metallization layer 202 and the lower metallization layer 204. The PCB 200 has a front side 208 and a back side 210. The insulating layer 206 may be made of, for example, a glass fiber reinforced (fiberglass) epoxy resin, aka FR 4. The metallization layer(s) 202, 204 may be made of copper foil bonded to one or both sides of the insulating layer 206. For multilayer PCBs, this base PCB 200 is referred to as a "laminant" layer or "panel".

Figure 3:
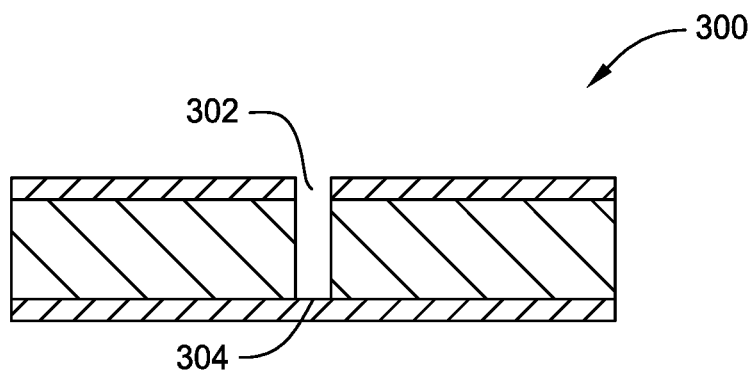
FIG. 3 is a cross-sectional side view of a PCB structure 300 corresponding to the PCB structure of FIG. 2 after forming a hole in the PCB structure for each fusible via to be formed in the PCB.

FIG. 3 is a cross-sectional side view of a PCB structure 300 corresponding to the PCB structure 200 of FIG. 2 after forming a hole 302 in the PCB structure 300 for each fusible via 100 to be formed in the PCB 200. The depth of the hole 302 penetrates the upper metallization layer 202 and the insulating layer 206 of the PCB 200 and terminates on a top surface 304 of the lower metallization layer 204. The hole 302 does not penetrate the lower metallization layer 204. This limited depth drilling technique is employed for "back-drilling" vias where an unwanted metal stub in the via hole 302 is removed for signal integrity purposes. The diameter of the drilled hole 302 may differ in diameter (i.e., smaller) from a conventional via and is tailored based on the desired current density required to fuse open the electrical connection formed by the fusible via 100.

Figure 4:
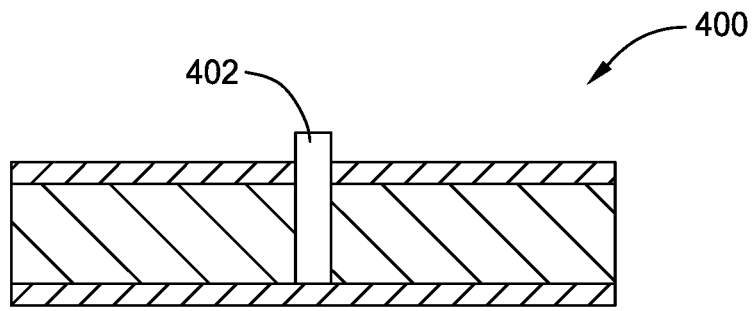
FIG. 4 is a cross-sectional side view of a PCB structure 400 corresponding to the PCB structure of FIG. 3 after filling the hole with a fusible material comprising the alloy and the blowing agent.

FIG. 4 is a cross-sectional side view of a PCB structure 400 corresponding to the PCB structure 300 of FIG. 3 after filling the hole 302 with a fusible material comprising the alloy and the blowing agent to form the handle portion 402 of the fusible via 100. The hole 302 may be filled with the fusible material using a conventional photo-resist as a mask, then deposited using any suitable deposition technique (e.g., CVD), then etched to form the handle portion 106 of the fusible via 100.

Figure 5:
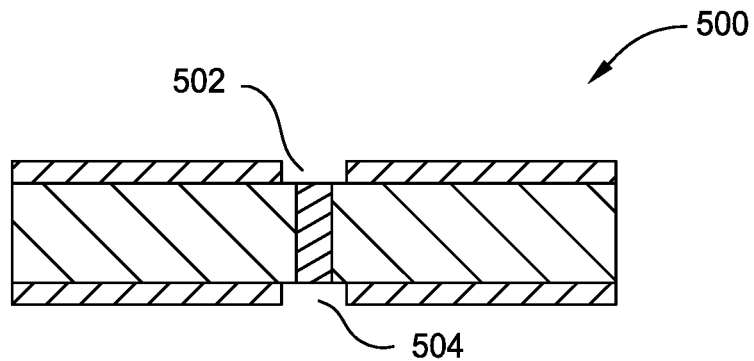
FIG. 5 is a cross-sectional side view of a PCB structure 500 corresponding to the PCB structure of FIG. 4 after forming larger diameter holes than the hole in both the upper metallization layer and the lower metallization layer, respectively.

FIG. 5 is a cross-sectional side view of a PCB structure 500 corresponding to the PCB structure 400 of FIG. 4 after forming larger diameter holes 502, 504 than the hole 302 in both the upper metallization layer 202 and the lower metallization layer 204, respectively.

Figure 6:
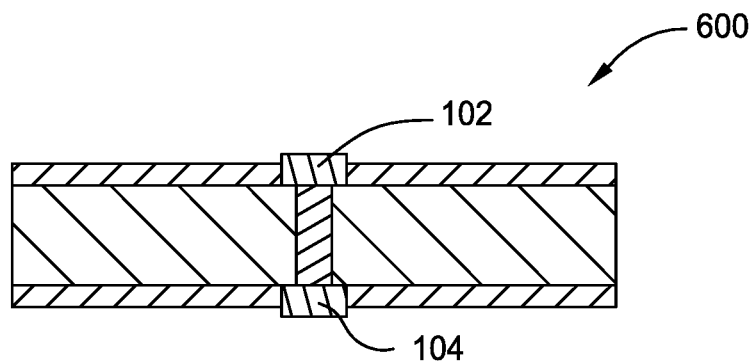
FIG. 6 is a cross-sectional side view of a PCB structure 600 corresponding to the PCB structure of FIG. 5 after filling the larger diameter holes with an interconnect metal (e.g., deposited copper/alloy).

FIG. 6 is a cross-sectional side view of a PCB structure 600 corresponding to the PCB structure 500 of FIG. 5 after filling the larger diameter holes 502, 504 with a interconnect metal (e.g., deposited copper/alloy) to form the contacts 102, 104. The contacts 102, 104 may formed with the interconnect metal using a conventional photo-resist as a mask, then deposited using any suitable deposition technique (e.g., CVD), then etched to form the form the upper contact 102 and the lower contact 104 of the fusible via 100.

Figure 7:
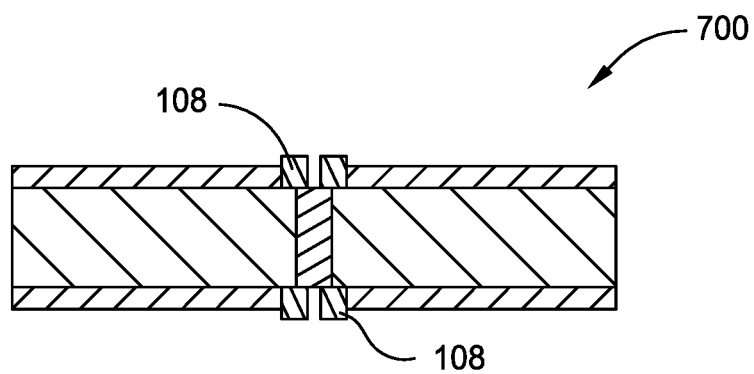
FIG. 7 is a cross-sectional side view of a PCB structure 700 corresponding to the PCB structure of FIG. 6 after drilling one or more vent holes in the upper contact and optionally the lower contact to complete the fusible via for a single layer PCB.

FIG. 7 is a cross-sectional side view of a PCB structure 700 corresponding to the PCB structure 600 of FIG. 6 after drilling one or more vent holes 108 in the upper contact 102 and optionally the lower contact 104 to complete the fusible via 100 for a single layer PCB 200. The vent holes 108 extend from an external surface of the upper contact 102 and/or lower contact 104 to the handle portion 106 to permit blowing agent gases to escape from the PCB structure 700.

Figure 8:
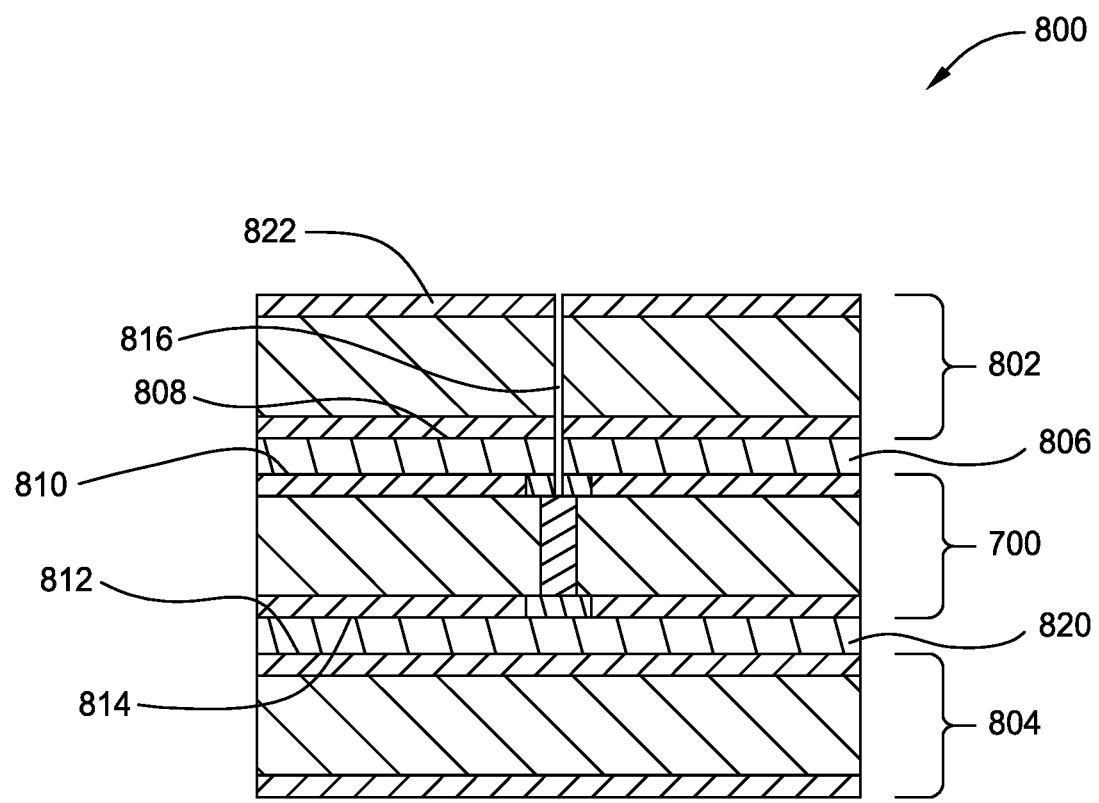
FIG. 8 is a cross-sectional side view of a multi-layer PCB structure 800 wherein additional PCB layers with the fusible via are formed in the PCB layer between the additional PCB layers, thereby forming a buried fusible via.
Figure 9:
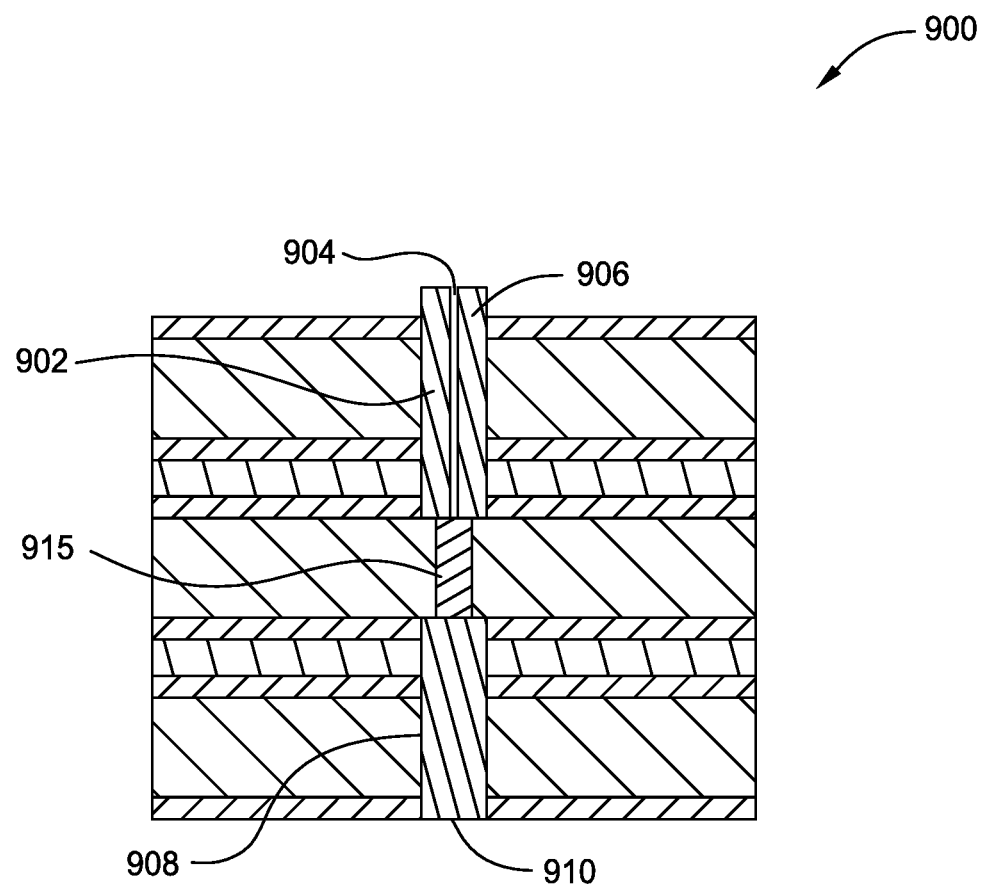
FIG. 9 is a multilayer PCB structure similar to FIG. 8, except that additional columns of the additional insulator material extend from the upper contact and optionally the lower contact to top and bottom surfaces of the multilayer PCB, thereby forming a through-hole fusible via.

The PCB structure 700 is now ready for further processing such as creating a multilayer PCB 800, 900, or for directly for component assembly. FIGS. 8 and 9 are two embodiments for forming fusible vias in multilayer PCBs 800, 900, respectively. FIG. 8 is a cross-sectional side view of a multi-layer PCB structure 800 wherein one or more upper PCB layers 802 is formed overlaying the PCB structure 700 and a one or more lower PCB layers 804 is formed underlying the PCB structure 700. An additional insulator layer 806 may be formed between the back side 808 of the first of the upper PCB layers 802 and the front side 810 of the PCB structure 700. An additional insulator layer 820 may be formed between the front side 812 of the first of the lower PCB layers 804 and the back side 814 of the PCB structure 700. The additional insulator layers 806, 820 may be made of prepreg. A vent hole 816 may extend from the upper surface of PCB 700, through one or more insulating layers 806, and further though the additional one or more upper PCB layers 802 to a top surface 822. This example completes the buried fusible via structure.

FIG. 9 is similar to FIG. 8, except that an elongated upper contact 902 having a vent hole 904 therein may extend from the insulating layer 206 of the PCB 700 to an upper surface 906 overlying the uppermost one or more upper PCB layers 802. Similarly, an elongated lower contact 908 without a vent hole may extend from the insulating layer 206 of the PCB 700 to a lower surface 910 underlying the lowermost one or more lower PCB layers 804. The contacts 902, 908 have a greater length than the contacts 102, 104.

The composite stack of the multi-layer PCB 900 with the fusible via 915 formed therein is then cured under high temperature/pressure. All the familiar types of PCB vias can be constructed including buried vias, blind vias and through-hole vias. There are only two restrictions: at least one fusible via is maintained in the composite stack in order to assure the fusing action, and a vent hole as shown in FIGS. 8 and 9 needs to be formed from the fusible via 800, 900 to either of the upper surfaces 906 and 822 of the multilayer PCB 900 and 800; and/or the lower surfaces accordingly.

Figure 10:
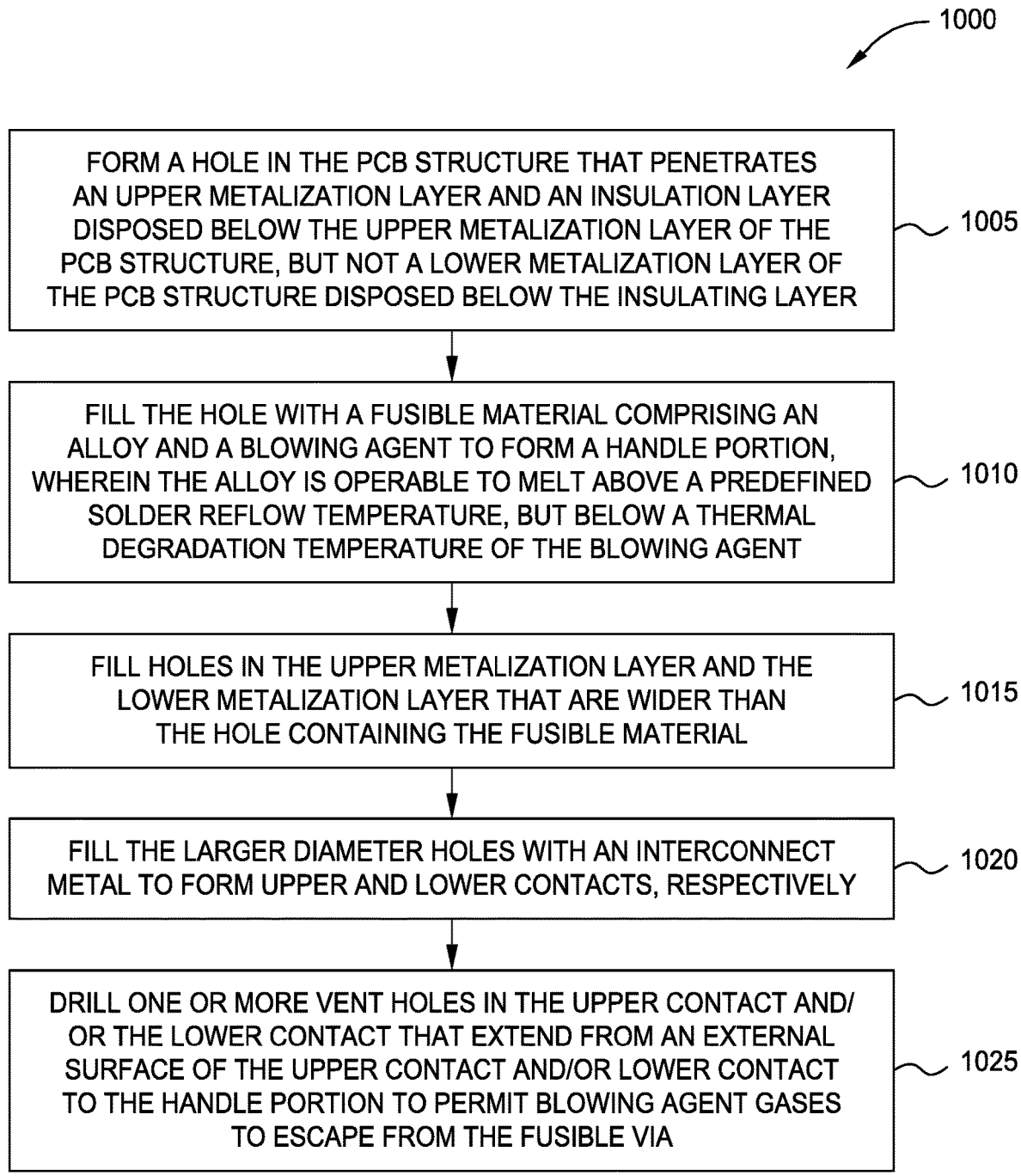
FIG. 10 is a process flow diagram 1000 illustrating a method for forming an in-situ fusible via in a PCB.

FIG. 10 is a process flow diagram illustrating a method for forming an in-situ fusible via in a PCB. At block 1005, a hole is formed in the PCB structure that penetrates an upper metallization layer and an insulation layer disposed below the upper metallization layer of the PCB structure, but not a lower metallization layer of the PCB structure disposed below the insulating layer. At block 1010, the hole is filled with a fusible material comprising an alloy and a blowing agent to form a handle portion, wherein the alloy melts above a predefined solder reflow temperature but below a thermal degradation temperature of the blowing agent. At block 1015, holes are formed in the upper metallization layer and the lower metallization layer that are wider than the hole containing the fusible material. At block 1020, the larger diameter holes are filled with an interconnect metal to form upper and lower contacts, respectively. At block 1025, one or more vent holes are drilled in the upper contact and/or the lower contact that extend from an external surface of the upper contact and/or lower contact to the handle portion to permit blowing agent gases to escape from the fusible via.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present invention, other and further embodiments of the invention may be devised without departing from the basic scope thereof, and the scope thereof is determined by the claims that follow.

What is claimed is:

1. A method for forming a fusible via in a printed circuit board (PCB) structure having two or more metallization layers, comprising:
   forming a hole in the PCB structure that penetrates an upper metallization layer and an insulation layer disposed below the upper metallization layer of the PCB structure, but not a lower metallization layer of the PCB structure disposed below the insulating layer;
   filling the hole with a fusible material comprising an alloy and a blowing agent to form a handle portion, wherein the alloy melts above a predefined solder reflow temperature but below a thermal degradation temperature of the blowing agent;
   forming holes in the upper metallization layer and the lower metallization layer that are wider than the hole containing the fusible material; and
   filling the holes with an interconnect metal to form upper and lower contacts, respectively.

2. The method of claim 1, further comprising:
   drilling at least one vent hole in at least one of the upper contact and the lower contact that extends from an external surface of at least one of the upper contact and lower contact to the handle portion to permit blowing agent gases to escape from the handle portion.

3. The method of claim 1, wherein a length and a diameter of the handle portion are variable to accommodate different blowing currents.

4. The method of claim 1, wherein the blowing agent is one or more of Phthalic anhydride, Terephthalic acid, or Adamantane.

5. The method of claim 1, wherein the alloy is one or more of lead-tin, lead-tin-silver, or bismuth.

6. The method of claim 1, further comprising:
   forming one or more upper PCB layers overlaying the PCB structure and one or more lower PCB layers underlying the PCB structure;
   forming second insulator layers between each of the one or more upper PCB layers and the one or more lower PCB layers including a back-side PCB structure and a front side of the PCB structure; and
   forming a vent hole extending from one end of the handle portion in contact with the upper contact to an uppermost surface of an upper most PCB layer of the one or more upper PCB layers.

7. The method of claim 6, further comprising:
   extending the upper contact of the PCB structure from the one end of the handle portion to the uppermost surface of an upper most PCB layer of the one or more upper PCB layers; and
   extending the lower contact of the PCB structure from the other end of the handle portion to a lowermost surface of a lowermost most PCB layer of the one or more lower PCB layers.

* * * * *